United States Patent
Chiang et al.

(10) Patent No.: US 9,826,312 B2
(45) Date of Patent: Nov. 21, 2017

(54) CIRCUIT AND METHOD FOR DRIVING A LOUDSPEAKER

(71) Applicant: REALTEK SEMICONDUCTOR CORP., Hsinchu (TW)

(72) Inventors: Ming-Cheng Chiang, Hsinchu (TW); Chia-Chi Tsai, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 67 days.

(21) Appl. No.: 14/527,960

(22) Filed: Oct. 30, 2014

(65) Prior Publication Data

US 2015/0124983 A1    May 7, 2015

(30) Foreign Application Priority Data

Nov. 1, 2013   (TW) .............................. 102139759 A

(51) Int. Cl.
*H04R 29/00* (2006.01)
*H04R 5/04* (2006.01)
*H04R 3/00* (2006.01)
*H03F 3/217* (2006.01)

(52) U.S. Cl.
CPC .............. *H04R 5/04* (2013.01); *H03F 3/217* (2013.01); *H04R 3/00* (2013.01); *H04R 29/001* (2013.01)

(58) Field of Classification Search
CPC .......... H04R 5/04; H04R 29/001; H04R 3/00; H04R 39/00; H03G 3/348; H03G 3/34; H03G 11/00; H03F 1/30; H03F 3/2173
USPC .............. 381/59, 120, 121, 68, 55; 330/251; 700/94, 162; 324/713
See application file for complete search history.

(56) References Cited

U.S. PATENT DOCUMENTS

| | | | | |
|---|---|---|---|---|
| 3,588,726 A | * | 6/1971 | Kabrick | H03G 11/00 330/145 |
| 4,746,816 A | * | 5/1988 | Olesen | G01R 19/04 324/103 P |
| 5,410,592 A | * | 4/1995 | Wagner | H03F 3/2171 330/251 |
| 6,385,500 B1 | * | 5/2002 | Hebbar | B23H 7/265 219/69.11 |
| 7,622,984 B2 | | 11/2009 | Lesso et al. | |

(Continued)

FOREIGN PATENT DOCUMENTS

| CN | 1960175 | 5/2007 |
|---|---|---|
| CN | 102638743 | 8/2012 |
| TW | I316824 | 11/2009 |

OTHER PUBLICATIONS

State Intellectual Property Office of the People's Republic of China, "Office Action", dated Jun. 13, 2017.

*Primary Examiner* — Vivian Chin
*Assistant Examiner* — Ubachukwu Odunukwe
(74) *Attorney, Agent, or Firm* — WPAT, PC

(57) ABSTRACT

A circuit for driving a loudspeaker is disclosed. The circuit includes: a signal generator connected to the loudspeaker, generating a first signal comprising a first pulse with positive value and a second pulse with negative value; a detection circuit connected to the loudspeaker, detecting a second signal produced by the loudspeaker in response to the first signal; and a processing circuit connected to the signal generator and the detection circuit, calculating the impedance of the loudspeaker according to the second signal; wherein each pulse width of the first and second pulses is between 100 ns and 900 ns.

18 Claims, 5 Drawing Sheets

(56) References Cited

U.S. PATENT DOCUMENTS

| | | | |
|---|---|---|---|
| 7,663,429 B2 | 2/2010 | Wang | |
| 2007/0057720 A1* | 3/2007 | Hand | H03F 1/523 330/10 |
| 2008/0161953 A1* | 7/2008 | Takagishi | H03F 3/2173 700/94 |
| 2010/0194413 A1* | 8/2010 | Dalbjorn | H03F 1/52 324/713 |
| 2012/0189141 A1* | 7/2012 | Matsumoto | H04R 3/007 381/123 |

* cited by examiner

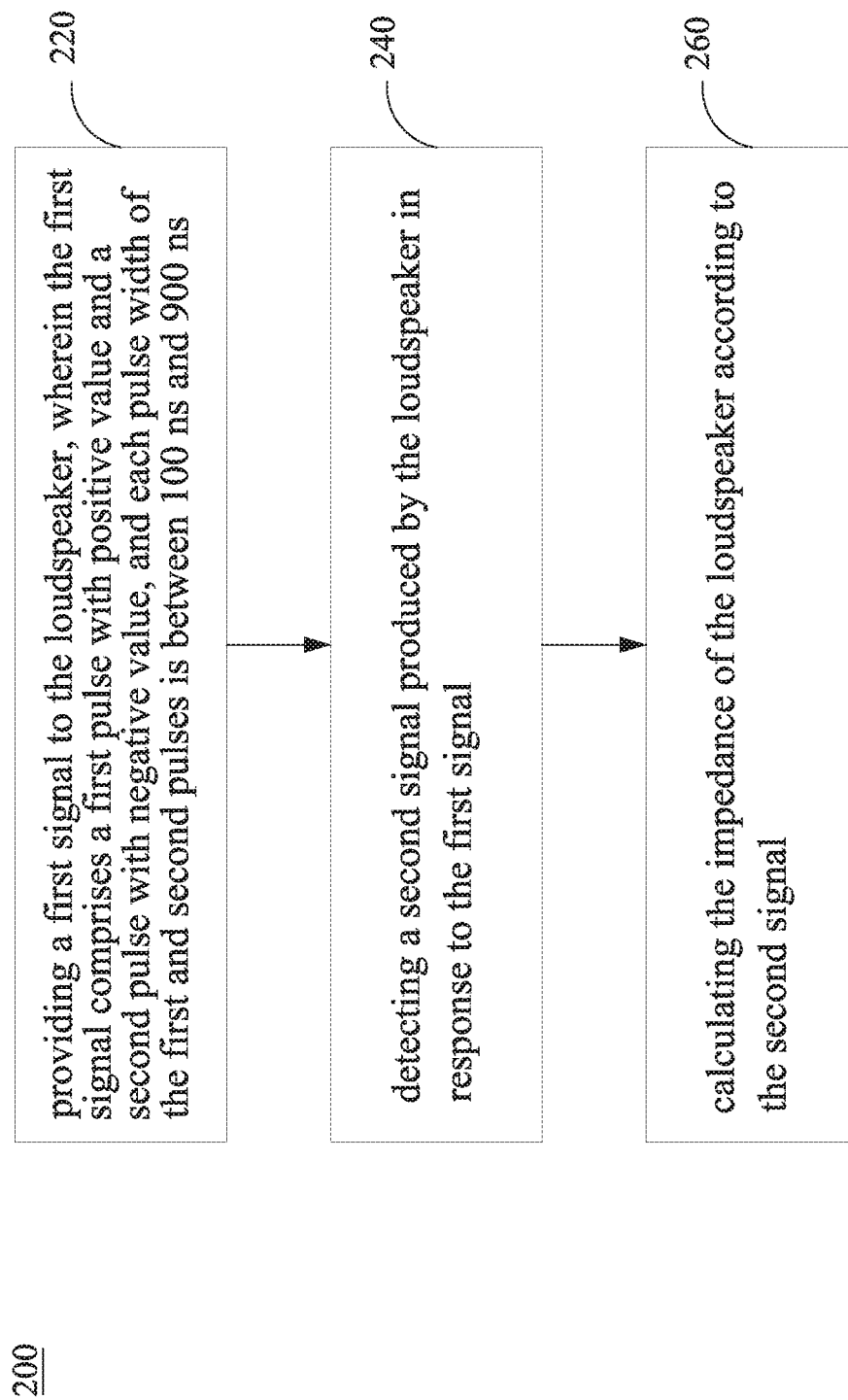

CIRCUIT AND METHOD FOR DRIVING A LOUDSPEAKER

This application claims the benefit of Taiwan application Serial No. 102139759, filed on Nov. 1, 2013, the disclosure of which is incorporated by reference herein in its entirety.

TECHNICAL FIELD

The present disclosure relates to a circuit and a method for driving a loudspeaker, which can detect the impedance of the loudspeaker without the production of pop-like discontinuous noises.

TECHNICAL BACKGROUND

CODEC devices, capable of encoding and decoding a digital data signal, have been widely used in portable electronic products such as mobile phone and tablet computer. Users of an electronic product may choose different types of loudspeakers, e.g. earphone, home-use or car-use audio, to output sound. Conventionally, the loudspeaker driver can be designed to have a function of estimating the impedance of the chosen loudspeaker, so it may predict the most possible type of loudspeaker. Thus, the driver can estimate a proper power level for the loudspeaker accordingly, to produce sound of comfortable loudness.

However, it takes a long time, usually more than tens of milli-seconds, to perform the impedance detection, and pop-like discontinuous noises may be induced during the detection. Consequently, it is in need to develop a new loudspeaker driving technique.

TECHNICAL SUMMARY

According to one aspect of the present disclosure, one embodiment provides circuit for driving a loudspeaker, which includes: a signal generator connected to the loudspeaker, generating a first signal comprising a first pulse with positive value and a second pulse with negative value; a detection circuit connected to the loudspeaker, detecting a second signal produced by the loudspeaker in response to the first signal; and a processing circuit connected to the signal generator and the detection circuit, calculating the impedance of the loudspeaker according to the second signal; wherein each pulse width of the first and second pulses is between 100 ns and 900 ns.

According to another aspect of the present disclosure, another embodiment provides a method for driving a loudspeaker, which includes the steps of: providing a first signal to the loudspeaker, wherein the first signal comprises a first pulse with positive value and a second pulse with negative value, and each pulse width of the first and second pulses is between 100 ns and 900 ns; detecting a second signal produced by the loudspeaker in response to the first signal; and calculating the impedance of the loudspeaker according to the second signal.

In the embodiment, the first signal is an electrical voltage or current signal.

In the embodiment, each of the first and second pulses may comprise a rectangular pulse.

In the embodiment, the first pulse has an amplitude different from that of the second pulse, the pulse width of the first pulse is different from that of the second pulse, and the falling edge of the first pulse is temporally spaced from the rising edge of the second pulse.

In the embodiment, the first signal may comprise a plurality of first pulses with positive value and a plurality of second pulses with negative value, and the first and second pulses are arranged alternately in the time domain.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein:

FIG. 5 shows a flow chart of a method for driving a loudspeaker according to one embodiment of the present disclosure.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings.

In the following description of the embodiments, it is to be understood that when an element such as a layer (film), region, pattern, or structure is stated as being "on" or "under" another element, it can be "directly" on or under another element or can be "indirectly" formed such that an intervening element is also present. Also, the terms such as "on" or "under" should be understood on the basis of the drawings, and they may be used herein to represent the relationship of one element to another element as illustrated in the figures. It will be understood that this expression is intended to encompass different orientations of the elements in addition to the orientation depicted in the figures, namely, to encompass both "on" and "under". In addition, although the terms "first", "second" and "third" are used to describe various elements, these elements should not be limited by the term. Also, unless otherwise defined, all terms are intended to have the same meaning as commonly understood by one of ordinary skill in the art.

Figure 1:
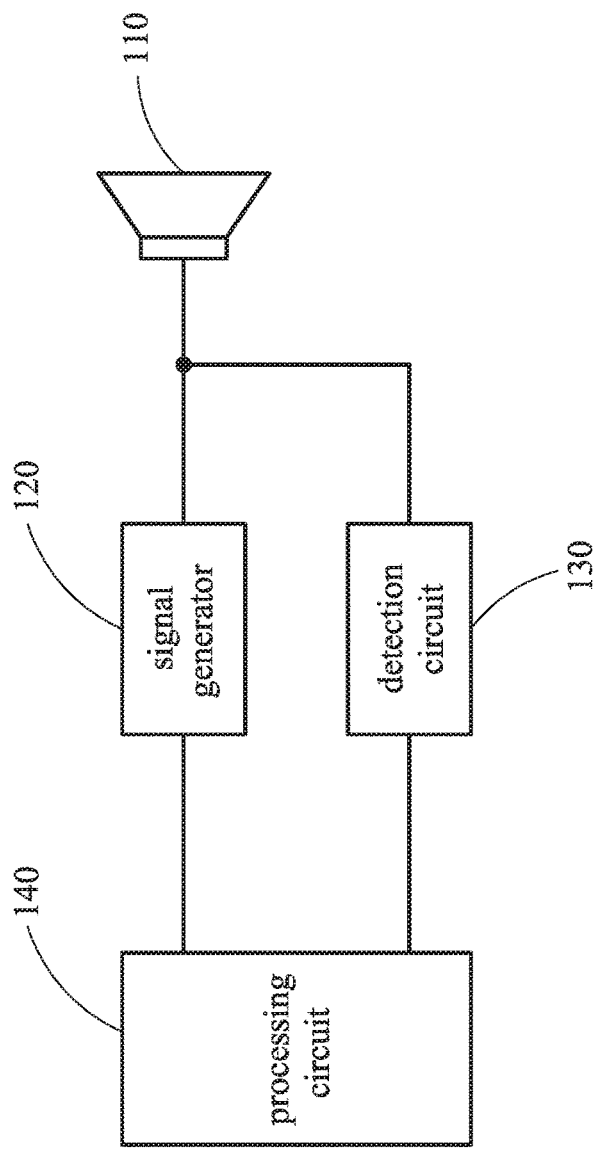
FIG. 1 shows a block diagram of a driving circuit according to an embodiment of the present disclosure.

FIG. 1 schematically shows a block diagram of a driving circuit 100 according to an embodiment of the present disclosure. The driving circuit 100 is configured for detecting the impedance of an audio output load, e.g. a loudspeaker 110, so as to provide the loudspeaker 110 with an electrical audio signal input of proper power level. As shown in FIG. 1, the driving circuit 100 includes a signal generator 120, a detection circuit 130, and a processing circuit 140. The loudspeaker 110 can be an earphone, a home-use or car-use audio. Because different users may choose different types of loudspeakers for the same audio system, the driving circuit 100 in the embodiment is used to measure the impedance of the chosen loudspeaker in a very short time, so as to roughly determine a proper power level for the electrical audio signal input to be delivered to the loudspeaker 110. This can prevent the loudspeaker 110 from generating a discontinuous noise, like pop noise, in the early stage of operation. For example, if the loudspeaker 110 has large impedance, the driving circuit 100 may provide the loudspeaker 110 with an audio signal input of large power; or if the loudspeaker 110 has small impedance, the driving circuit 100 may provide the loudspeaker 110 with an audio signal input of small power.

As shown in FIG. 1, the signal generator 120 is connected to the loudspeaker 110 for generating a first signal as an input to be fed into the loudspeaker 110. In the embodiment, the first signal includes a first pulse with positive value and a second pulse with negative value, so that the first signal has a minimum low-frequency portion. The high-frequency portion, of which human ears are insensible, of the first signal cannot be suppressed by this means, but it won't cause the above-recited discontinuous noise.

Figure 2:
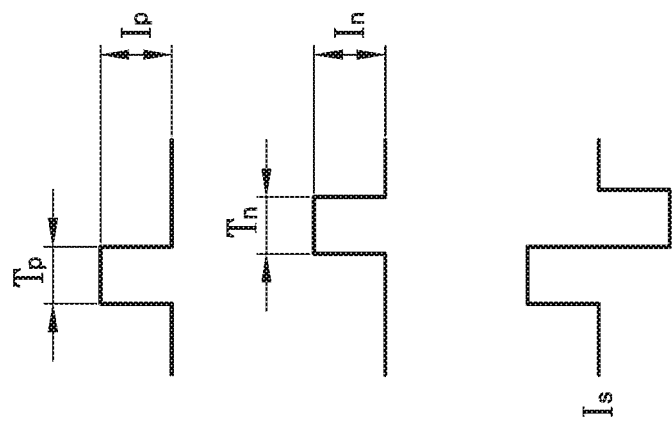
FIG. 2 shows a circuit diagram of the signal generator in FIG. 1 by means of constant current sources.
Figure 2:
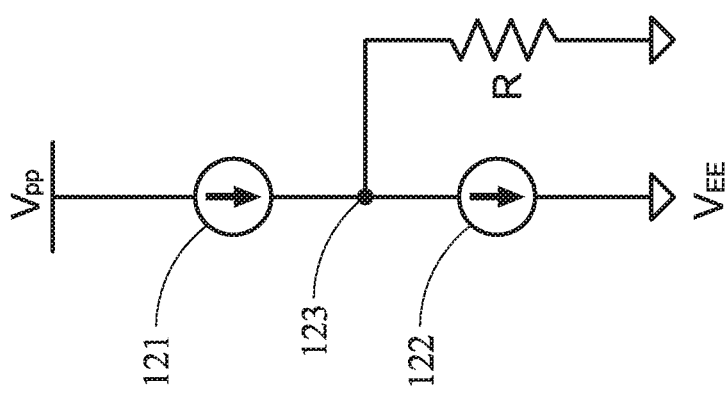

The first signal can be in the form of electrical voltage or current; i.e. the first signal may be an electrical voltage or current signal. In the following example, constant current sources are used to construct the signal generator 120 as shown in FIG. 2. The signal generator 120 includes a first constant current source 121 and a second constant current source 122, which are connected at a connection terminal 123. The first and second constant current sources 121 and 122 are connected to a positive power supply with voltage $V_{PP}$ and a negative power supply with voltage $V_{EE}$, so that the first constant current source 121 can produce the first pulse with amplitude $I_p$ and pulse width $T_p$, and the second constant current source 122 can produce the second pulse with amplitude $I_n$ and pulse width $T_n$. The first pulse and the second pulse are combined at the connection terminal 123 to form the first signal $I_s$. Here, the first signal $I_s$ consists of the non-inverting first pulse and the inverting second pulse. It is used to detect the impedance R of the loudspeaker 110. The waveforms of the first pulse, the second pulse, and the first signal $I_s$ can be schematically shown in the right sub-plots of FIG. 2.

When the first signal $I_s$ is fed into the loudspeaker 110, the loudspeaker 110 will produce a second signal in response to the first signal $I_s$. The second signal can be in the form of electrical voltage or current, too. Wherein, if the first signal is a current signal, then the second signal is a voltage signal; while if the first signal is a voltage signal, then the second signal is a current signal. In the present embodiment, the first signal $I_s$ is a current signal and the second signal is the voltage difference created by the first signal $I_s$ flowing through the loudspeaker 110 with impedance R. This can be used to estimate the impedance R of the loudspeaker 110. The detection circuit 130 is connected to the loudspeaker 110 for detecting the second signal, which is to be forwarded to the processing circuit 140 for calculating the impedance R of the loudspeaker 110. The processing circuit 140 is connected to both the signal generator 120 and the detection circuit 130 to obtain the first signal $I_s$ fed into the loudspeaker 110 and the second signal in response to the first signal $I_s$; thus, the impedance R of the loudspeaker 110 can be calculated.

Figure 3A:
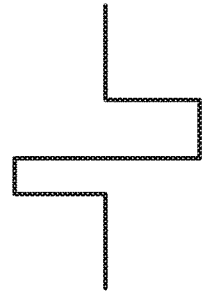
FIG. 3A to 3F show various pulse shapes of the first signal for detecting the impedance of the loudspeaker.
Figure 3B:
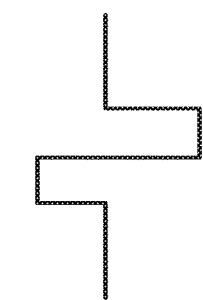
Figure 3C:
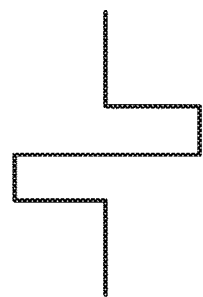
Figure 3D:
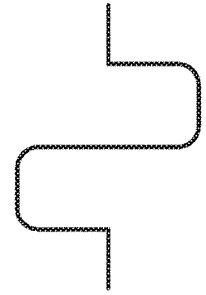

Considering the first signal in some preferable embodiments, each of the first and second pulses is a rectangular pulse with a pulse width of between 100 ns and 900 ns. In the following paragraphs, several waveform examples are given for the first signal, referring to the right sub-plots of FIG. 2. In a first example, the first pulse has amplitude $I_p$ equal to that $I_n$ of the second pulse and has a pulse width $T_p$ equal to that $T_n$ of the second pulse. Wherein, the falling edge of the first pulse and the rising edge of the second pulse happen at the same moment as shown in FIG. 3A. In a second example, the first pulse has amplitude $I_p$ less than that $I_n$ of the second pulse and has a pulse width $T_p$ equal to that $T_n$ of the second pulse. Wherein, the falling edge of the first pulse and the rising edge of the second pulse happen at the same moment as shown in FIG. 3B. In a third example, the first pulse has amplitude $I_p$ equal to that $I_n$ of the second pulse and has a pulse width $T_p$ less than that $T_n$ of the second pulse. Wherein, the falling edge of the first pulse and the rising edge of the second pulse happen at the same moment as shown in FIG. 3C. In a fourth example, the first pulse has an amplitude $I_p$ equal to that $I_n$ of the second pulse and has a pulse width $T_p$ less than that $T_n$ of the second pulse. Wherein, the falling edge of the first pulse and the rising edge of the second pulse are spaced out a time interval $T_d$ apart, as shown in FIG. 3D.

Figure 3E:
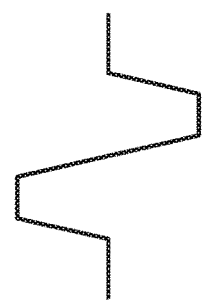
Figure 3F:
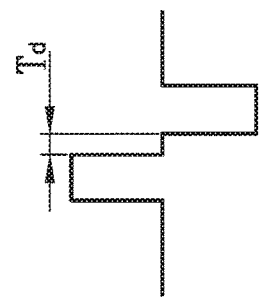

Generally speaking, the amplitude $I_p$ of the first pulse can be different from that $I_n$ of the second pulse, the pulse width $T_p$ of the first pulse can be different from that $T_n$ of the second pulse, and the falling edge of the first pulse and the rising edge of the second pulse can be temporally spaced, i.e. out a time interval $T_d$ apart in the time domain. This disclosure does not limit the waveforms of the first and second pulses. Moreover, the first and second pulses may have a pulse shape other than rectangle; for example, each of the first and second pulses may be a trapezoid pulse (as shown in FIG. 3E) or a rectangle-like pulse with curved edges (as shown in FIG. 3F). By means of the first signal, consisting of a first pulse of positive value and a second pulse of negative value, to detect the impedance of an audio output load (the loudspeaker 110 in the embodiment), we can prevent the audio output load from producing low-frequency sound, e.g. the sound with frequency less than 20 KHz. The audio output load may produce high-frequency sound which cannot be sensed by human ears, but the high-frequency portion may not affect people's hearing like noise.

Figure 4A:
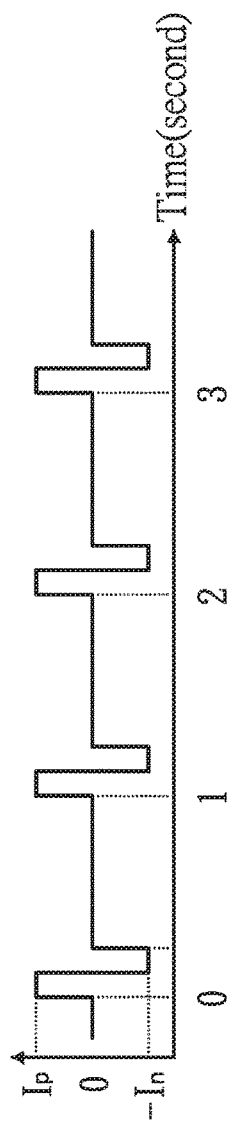
FIG. 4A to 4B show various waveforms of the first signal with periodic pulses.

In one embodiment, we may use a function generator to generate a pulse wave or pulse train as an input signal for the loudspeaker 110. Taking the first signal of FIG. 3A as an example, the input signal can be the periodic version of the first signal with a period of 1 second, in which the first signal repeats every second. The pulse wave, with its waveform shown in FIG. 4A, can be used as a detecting signal in the driving circuit 100 to detect the impedance of the loudspeaker 110. But it is not limited in this disclosure, the pulse wave can be composed of the first signal of any of FIG. 3B-3F or the first signal in the other pulse shapes.

Figure 4B:
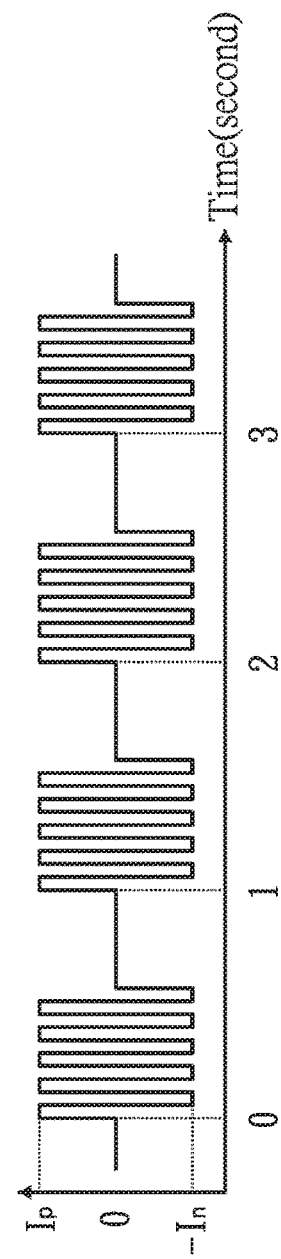

In another embodiment, we may use a function generator to generate another pulse wave or pulse train as an input signal for the loudspeaker 110. Taking the first signal of FIG. 3A as an example, the input signal is composed of several first signals, e.g. five first signals as shown in FIG. 4B, in a period of second, where a group of the first signals repeats every 1 second. The pulse wave, with its waveform shown in FIG. 4B, can be used as a detecting signal in the driving circuit 100 to detect the impedance of the loudspeaker 110. That is to say, the detecting signal includes a plurality of first pulses of positive value and a plurality of second pulses of negative value, and the first and second pulses are arranged alternately in the time domain. But it is not limited in this disclosure, the pulse wave can be composed of the first signal of any of FIG. 3B-3F or the first signal in the other pulse shapes.

FIG. 5 shows a flow chart of a method 200 for driving a loudspeaker according to one embodiment of the present disclosure. The method 200 can be used to detect the impedance of an audio output load, e.g. a loudspeaker, so as to provide the loudspeaker with an electrical audio signal input of proper power level. The method 200 includes the steps of: (Step 220) providing a first signal to the loudspeaker, wherein the first signal comprises a first pulse with positive value and a second pulse with negative value, and each pulse width of the first and second pulses is between 100 ns and 900 ns; (Step 240) detecting a second signal produced by the loudspeaker in response to the first signal; and (Step 260) calculating the impedance of the loudspeaker according to the second signal.

The method 200 in the embodiment can be performed according to the driving circuit 100 of FIG. 1. For example, the signal generator 120 can be used to generate the first signal in Step 220, the detection circuit 130 can be used to detecting the second signal in Step 240, and the processing circuit 140 can be used to calculate the impedance of the loudspeaker. Referring to FIG. 1 and its descriptions in the above paragraphs, the embodiment can be performed according to the method 200, and the waveforms in FIGS. 3A-3F and FIGS. 4A and 4B can be used as the first signal for detecting the impedance of the loudspeaker.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A circuit for driving a speaker, comprising:
    a signal generator, providing a first signal to the speaker, the first signal comprising:
        a first pulse, with a positive value and a first pulse width between 100 nanoseconds and 900 nanoseconds, and
        a second pulse, with a negative value and a second pulse width between 100 nanoseconds and 900 nanoseconds;
    a detection circuit, detecting a second signal produced by the speaker in response to the first signal; and
    a processing circuit, connected to the signal generator and the detection circuit, receiving the second signal from the detection circuit and calculating the impedance of the speaker according to the second signal.

2. The circuit according to claim 1, wherein the first signal is an electrical voltage signal.

3. The circuit according to claim 1, wherein the first signal is an electrical current signal.

4. The circuit according to claim 1, wherein each of the first and second pulses comprises a rectangular pulse.

5. The circuit according to claim 4, wherein the first pulse has an amplitude different from that of the second pulse.

6. The circuit according to claim 4, wherein the first pulse width is different from the second pulse width.

7. The circuit according to claim 4, wherein the falling edge of the first pulse is temporally spaced from the rising edge of the second pulse.

8. The circuit according to claim 1, wherein the first signal comprises a plurality of first pulses of positive value and a plurality of second pulses of negative value, and the first and second pulses are arranged alternately in the time domain.

9. A method for driving a speaker, comprising:
    providing a first signal to the speaker by a signal generator, wherein the first signal comprises:
        a first pulse with a positive value and a first pulse width between 100 nanoseconds and 900 nanoseconds; and
        a second pulse with a negative value and a second pulse width between 100 nanoseconds and 900 nanoseconds;
    detecting a second signal produced by the speaker in response to the first signal by a detecting circuit; and
    calculating the impedance of the speaker according to the second signal by a processing circuit.

10. The method according to claim 9, wherein the first signal is an electrical voltage signal.

11. The method according to claim 9, wherein the first signal is an electrical current signal.

12. The method according to claim 9, wherein each of the first and second pulses comprises a rectangular pulse.

13. The method according to claim 12, wherein the first pulse has an amplitude different from that of the second pulse.

14. The method according to claim 12, wherein the first pulse width is different from the second pulse width.

15. The method according to claim 12, wherein the falling edge of the first pulse is temporally spaced from the rising edge of the second pulse.

16. The method according to claim 9, wherein the first signal comprises a plurality of first pulses with positive value and a plurality of second pulses with negative value, and the first and second pulses are arranged alternately in the time domain.

17. The method according to claim 10, wherein the second signal is an electrical current signal.

18. The method according to claim 11, wherein the second signal is an electrical voltage signal.

* * * * *